(12) United States Patent
Mehta

(10) Patent No.: US 6,214,666 B1
(45) Date of Patent: Apr. 10, 2001

(54) METHOD OF FORMING A NON-VOLATILE MEMORY DEVICE

(75) Inventor: Sunil D. Mehta, San Jose, CA (US)

(73) Assignee: Vantis Corporation, Sunnyvale, CA (US)

( * ) Notice: Subject to any disclaimer, the term of this patent is extended or adjusted under 35 U.S.C. 154(b) by 0 days.

(21) Appl. No.: 09/216,051

(22) Filed: Dec. 18, 1998

(51) Int. Cl.$^7$ ................................................ H01L 21/8247
(52) U.S. Cl. ........................... 438/257; 438/983; 438/302
(58) Field of Search ................................. 438/257–267, 438/983, 302

(56) References Cited

U.S. PATENT DOCUMENTS

| | | |
|---|---|---|
| 4,037,242 | 7/1977 | Gosney . |
| 4,885,719 | 12/1989 | Brahmbhatt . |
| 4,924,278 | 5/1990 | Logie ................................... 357/23.5 |
| 5,103,425 | 4/1992 | Kuo et al. . |
| 5,316,961 * | 5/1994 | Okazawa . |
| 5,366,915 | 11/1994 | Kodama . |
| 5,464,785 * | 11/1995 | Hong . |
| 5,474,947 * | 12/1995 | Chang et al. . |
| 5,486,480 * | 1/1996 | Chen . |
| 5,491,657 | 2/1996 | Haddad et al. .................. 365/185.27 |
| 5,554,552 | 9/1996 | Chi . |
| 5,587,945 | 12/1996 | Lin et al. . |
| 5,615,150 | 3/1997 | Lin et al. . |
| 5,640,346 | 6/1997 | Preslar . |
| 5,646,901 | 7/1997 | Sharpe-Geisler et al. . |
| 5,719,427 | 2/1998 | Tong et al. . |
| 5,742,542 | 4/1998 | Lin et al. .......................... 365/185.08 |
| 5,761,116 | 6/1998 | Li et al. . |
| 5,783,457 | 7/1998 | Hsu . |
| 5,912,488 | 6/1999 | Kim et al. . |
| 5,920,776 * | 7/1999 | Fratin et al. .......................... 438/257 |
| 5,969,992 | 10/1999 | Mehta et al. . |
| 5,994,185 * | 11/1999 | Sheu et al. .......................... 438/257 |
| 6,048,770 * | 4/2000 | Sakakibara .......................... 438/291 |

FOREIGN PATENT DOCUMENTS

| | | |
|---|---|---|
| 0 295 935 A1 | 12/1988 | (EP) . |
| 0 354 457 | 2/1990 | (EP) . |
| 0 714 133 | 5/1996 | (EP) . |
| 0 776 049 | 5/1997 | (EP) . |
| 0 865 045 | 9/1998 | (EP) . |
| 2 022 922 | 12/1979 | (GB) . |
| 60-053083 | 3/1985 | (JP) . |
| 6-204492 | 7/1994 | (JP) . |
| 10-074850 | 3/1998 | (JP) . |
| 10-223782 | 8/1998 | (JP) . |
| WO 93 18519 | 9/1993 | (WO) . |
| WO 97 02605 | 1/1997 | (WO) . |

OTHER PUBLICATIONS

"Performance Limitations of a Flash E$^2$PROM Cell, Programmed with Zener Induced Hot Electrons", by J. Ranaweera, I. Kalastirsky, A. Dibu–Caiole, W.T. Ng, and C.A.T. Salama, Proceedings of the 15th Annual Non–Volatile Semiconductor Memory Workshop, Paper #2.2 (1997).

* cited by examiner

Primary Examiner—Richard Booth
(74) Attorney, Agent, or Firm—Fliesler, Dubb, Meyer & Lovejoy LLP

(57) ABSTRACT

A method for manufacturing a non-volatile EEPROM memory cell, and a memory cell structure provided by the method. The method comprises the steps of: forming a gate stack on the surface of a substrate; forming a first and a second active regions in the substrate so that the first and second active regions extend to a depth below the surface of the substrate and have a first impurity type and an impurity concentration; and implanting a pocket region of an opposite conductivity type to that of the first or second active region into the surface of the substrate adjacent to the first active region. The step of implanting a pocket region may performed by implanting substantially at an angle non-normal to the surface of the substrate.

16 Claims, 9 Drawing Sheets

| Operation | ACG | BL | WL | WC | FG |
|---|---|---|---|---|---|
| Erase (bulk) | 0V | 8V | 0V | HiZ | -ve |
| Program | 8V | 8V | 0V | HiZ | -ve+$\Delta V_p$ |
| Not progr. | 0V | 8V | 0V | HiZ | -ve-$\Delta_p$ |
| Not progr. | 8V | 3.3V | 0V | HiZ | -ve |
| Read | 3.3V | ground | 3.3V | 3.3V | -ve(or+$\Delta V_p$) |

$\Delta_p$ = Programming disturb; it should be less than 1V.

$\Delta V_p$ = It will be in 3–8V range depending on programming time. $\Delta V_p \cong 4V$ for $t_{prog} \cong 10\mu s$.

*Assumed that the junction breakdown voltage is at 7.5V or below so that 8V operation is sufficient for junction breakdown.

FIG. 4B

METHOD OF FORMING A NON-VOLATILE MEMORY DEVICE

BACKGROUND OF THE INVENTION

1. Field of the Invention

The invention relates to non-volatile memory cells, and particularly non-volatile memory cells utilizing hot electron generation to add electrons to a floating gate.

2. Description of the Related Art

Non-volatile memory devices of the type commonly referred to in the art as EPROM, EEPROM, or Flash EEPROM serve a variety of purposes, and are hence provided in a variety of architectures and circuit structures.

As with many types of integrated circuit devices, some of the main objectives of non-volatile memory device designers are to increase the performance of devices, while decreasing device dimensions and consequently increasing circuit density. Cell designers strive for designs which are reliable, scalable, cost effective to manufacture and able to operate at lower power, in order for manufacturers to compete in the semiconductor industry. EEPROM devices are one such device that must meet these challenges. In some applications, such as flash memory cards, density is at a premium, while in applications such as programmable logic devices (PLD's), reliability is more important and space is at less of a premium.

As process technology moves toward the so-called 0.18 and 0.13 micron processes, the conventional "stacked gate" EEPROM structure has given way to different cell designs and array architectures, all intended to increase density and reliability in the resulting circuit. In addition, designers strive to reduce power requirements of devices by reducing program and erase voltage requirements.

In the self-aligned, "stacked gate" cell, a high quality oxide is required, as well as a unique drain and source structure optimized for program and erase operations, respectively, and complementary adaptive program and erase algorithms. Typically, in the stacked gate EEPROM, in order to store a logical zero, electrons are injected onto the floating gate to provide a negative voltage on the floating gate thus increasing the control gate threshold voltage needed to turn on the transistor. Likewise, in order to erase the EEPROM, electrons are removed from the floating gate thereby decreasing the threshold voltage and a logical one is stored on the gate. While stacked gate embodiments have existed and worked well for some time, improved alternative cells have resulted in higher performance integrated circuit devices.

One example of an alternative to the stacked gate EEPROM structure is shown in U.S. Pat. No. 4,924,278, issued to Stewart Logie on May 8, 1990 and assigned to the assignee of the present invention. The EEPROM structure disclosed therein utilizes a single layer of polycrystalline silicon so as to eliminate the need to form a separate control gate and floating gate. The EEPROM structure shown therein is made up of three separate NMOS transistors: a write transistor, a read transistor, and a sense transistor. In order to "program" the floating gate, a net positive charge is placed on the gate by removing free electrons from the floating gate. Likewise, to erase the floating gate, the floating gate is given a net negative charge by injecting electrons onto the floating gate. This basic EEPROM structure has been well exploited in commercial devices. Nevertheless, as process technologies and practical considerations drive designers toward higher performance, alternative designs are investigated. For example, the aforementioned cell structure requires, in a number of embodiments, a minimum oxide thickness of about 90 Å for the program junction oxide region to prevent charge loss due to direct tunneling under the presence of the high electric field across this region.

An alternative to the aforementioned Fowler-Nordheim tunneling-based cell structure is presented in Ranaweera, et al., "Performance Limitations of a Flash EEPROM Cell, Programmed With Zener Induced Hot Electrons," University of Toronto Department of Electrical Engineering (1997). Discussed therein is a flash EEPROM cell which accomplishes programming and erase by establishing a reverse breakdown condition at the drain/substrate junction, generating hot electrons which are then coupled to the floating gate to program the cell.

FIGS. 1A, 1B and 1C of Ranaweera, et al. are reproduced as FIGS. 1A, 1B and 1C of the present application. FIGS. 1B and 1C are cross-sections of the plan view of the cell shown in FIG. 1A. As shown in FIG. 1C, a "ZEEPROM" cell comprises a source and drain region, floating gate and control gate, with a P+ pocket implant extending part way across the width of the drain region to generate hot electrons for programming. The flash ZEEPROM cells are fabricated using CMOS compatible process technology, with the addition of a heavily doped boron implant for the P+ region replacing or in addition to the LDD region. A sidewall spacer is necessary to form the self-aligned N+ source and drain regions and to avoid counter-doping of the P+ pocket.

To program the flash ZEEPROM cell, the PN junction is reverse-biased to create an electric field of approximately $10^6$ volt/cm. and generate energetic hot electrons independent of the channel length. The P+ region adjacent to the drain enhances this generation. A low junction breakdown voltage can be used for programming by optimizing the PN junction depth and profiles. One disadvantage of this ZEEPROM is that a low drain voltage (approximately one volt) must be used to read the cell since the P+ region exhibits a low breakdown voltage which can contribute to "soft programming" due to unwanted charge injection to the gate (generally also referred to herein as "program disturb"). Erasing in the cell is performed by Fowler-Nordheim tunneling of electrons from the floating gate to the source region using a negative gate voltage and supply voltage connected to the source similar to conventional flash EEPROM cells.

Another alternative cell structure using hot election programming generated by a reverse breakdown condition at the drain is described in the context of a method for bulk charging and discharging of an array of flash EEPROM memory cells in U.S. Pat. No. 5,491,657 issued to Haddad, et al., assigned to the assignee of the present invention. In Haddad, et al., a cell structure similar to that shown in cross-section in FIG. 1B of the present application may be used, as well as a substrate-biased p-well in n-well embodiment. In the first embodiment, an N+ source region includes an N+ implant region and an N diffusion region, and the erase (removing electrons) operation is accomplished by applying (+)8.5 volts to the control gate for 100 milliseconds, and (+)5 volts to the source for 100 milliseconds, with the drain being allowed to float. In contrast, programming (adding electrons to the gate) is achieved by applying a negative 8.5 volt to the substrate for 5 microseconds, zero volts to the drain and control gate with the source floating. The bulk charging operation can just as easily be done on the source side rather than the drain side in a case where the cell is provided in a P well by applying −8.5 volts to the P well for 5 microseconds, 0 volts to the source and control gate with the drain being allowed to float.

Yet another structure and method for programming a cell is detailed in co-pending U.S. patent application Ser. No. 08/871,589, inventors Hao Fang, et al., filed Jul. 24, 1998 and assigned to the assignee of the present application. FIGS. 1A and 1B of the Fang, et al. application are reproduced herein as FIGS. 2A and 2B, and FIGS. 2A and 2B of the Fang application are reproduced as FIGS. 3A and 3B of the present application. The Fang, et al. application uses the programming method disclosed in Haddad, et al. to form a high density, low program/erase voltage and current, and fast byte programming and bulk-erase and fast reading speed non-volatile memory structure specifically designed for programmable logic circuit applications.

In Fang, et al. the non-volatile memory cell 10 in FIG. 2A, 2B is formed of a P substrate 12 having embedded therein an N+ source region 14, an N-type diffused drain region 16, a floating gate 18 capacitively coupled to the P substrate 12 through a tunnel oxide 20, or other gate dielectric such as nitride oxide; and a control gate 22 capacitively coupled to the floating gate 18 through an oxide/nitride/oxide, or other type of inter polysilicon dielectric, film 24,26. Diffused region 16 is formed of a shallowly diffused but heavily doped N-type junction, while source region 14 is formed of a deeply diffused but lightly doped N junction. The relatively thin gate dielectric 20 (an oxide of 60 to 150 Å in thickness) is interposed between top surface of substrate 12 and conductor polysilicon floating gate 18. Control gate 22 is supported above the floating gate by the inter-poly dielectric layer 24,26. Avalanche program and erase bias configurations of the memory cell of the Fang, et al. application are shown in FIGS. 3A and 3B, respectively.

Program and erase operations are illustrated in FIGS. 3A and 3B. To program the cell, electron injection is effected from the drain side. In this case, programming operation is accomplished by applying +3 volts on the drain and −6 volts on the P substrate so as to shift upwardly the threshold voltage $V_t$ by 4 volts in approximately 0.002 seconds. To erase, holes are injected from the drain side by applying +6.5 volts on the drain and −3 volts on the P substrate so as to shift down with the voltage threshold $V_t$ by 4 volts. Utilizing the substrate bias configuration suppresses hot hole injection due to the fact that the location of the high field is away from the oxide interface, the magnitude of the maximum field strength is reduced by more than 50%, and the vertical field does not favor hole injection.

FIGS. 4A and 4B show FIGS. 10A and 10B of the Fang, et al. application which teach a single polysilicon layer embodiment of the Fang, et al. cell. In such an embodiment, the control gate is replaced with a diffusion region. The control gate can be switched between 0 volts and $V_{cc}$ to select and de-select the cell during the read period and between $V_{jb}$ and 0 volts to program and erase the cells as set forth above. A select transistor is added at the source side to enable a fast read of the memory cell. In this operation, the gate of the added select transistor is set at less than or equal to zero volts during program and erasing and at $V_{cc}$ with $V_d$ less than or equal to $V_{cc}$ and $V_{dm}=0$ volts via turning on the memory cell for the read period. ($V_d$ is the drain voltage for the select transistor and $V_{dm}$ is the drain voltage for the memory transistor.) Cell size is decreased in comparison to conventional single poly memory cells for programmable logic devices. The bias configurations for the single poly memory cell are disclosed in FIG. 4B.

Generally, arrays of such individual memory cells are formed on a single substrate and combined with sense and read circuitry, and connected by row-wise and column-wise conductive regions or metallic conductors to allow for array wide bulk program and erase as well as selected bit programming.

Each of the aforementioned configurations presents advantages and disadvantages in use in particular applications. Nevertheless, improvements in both the structure of individual cells and the manner in which they are connected together will result in more reliable, stable, faster, and lower power devices which can be programmed and erased at lower voltages.

SUMMARY OF THE INVENTION

The invention, roughly described, comprises a method for manufacturing a non-volatile EEPROM memory cell, and a memory cell structure provided by the method. In one aspect, the method comprises the steps of: forming a gate stack on the surface of a substrate; forming a first active region and a second active region in the substrate so that the first and second active regions extend to a depth below the surface of the substrate and have a first impurity type and an impurity concentration; and implanting a pocket region of an opposite conductivity type to that of the first or second active regions into the surface of the substrate adjacent to the first region. In particular, the step of implanting a pocket region is performed by implanting substantially at an angle non-normal to the surface of the substrate.

In a unique aspect, the invention allows one to optimize formation of the pocket implant regions with greater control than formation of the region prior to forming the gate stack. Further, the method includes implanting the pocket region to a depth below the depth of the adjacent drain region.

The invention hence greatly simplifies formation of memory cells requiring such pocket conductivity regions for hot electron injection,

BRIEF DESCRIPTION OF THE DRAWINGS

The invention will be described with respect to the particular embodiments thereof. Other objects, features, and advantages of the invention will become apparent with reference to the specification and drawings in which:

FIG. 4B is a table showing the voltages utilized in accordance with the single poly memory cell shown in FIG. 4A.

DETAILED DESCRIPTION

A novel nonvolatile memory cell structure, and a method of forming the structure, are presented herein along with numerous examples of the use and application of the apparatus and method of the invention.

In the following description, numerous details, for example specific materials process steps, etc., are set forth in order to provide a thorough understanding of the invention. It will be readily understood, however, to one of average skill in the art that specific details need not be employed to practice the present invention. Moreover, specific details of particular processes or structures may not be specifically presented in order to not unduly obscure the invention where such details would be readily apparent to one of average skill in the art. Those having ordinary skill in the art and access to the teachings described herein will recognize additional modifications and applications and embodiments within the scope of the present invention.

The avalanche/Zener breakdown elements disclosed herein generally include two active regions separated by a channel region resembling a transistor with a source, drain, and gate. However, it should be understood that the use of such terms as "source" and "drain" with respect to the avalanche/Zener elements is for convenience only.

A First Avalanche/Zener Breakdown Cell

Figure 1B:
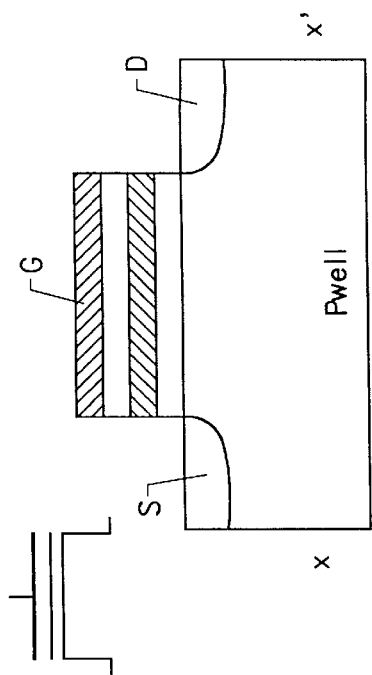
FIGS. 1B and 1C are cross-sections of a prior art reverse breakdown cell, and the Zener breakdown cell shown in FIG. 1A, respectively.
Figure 1C:
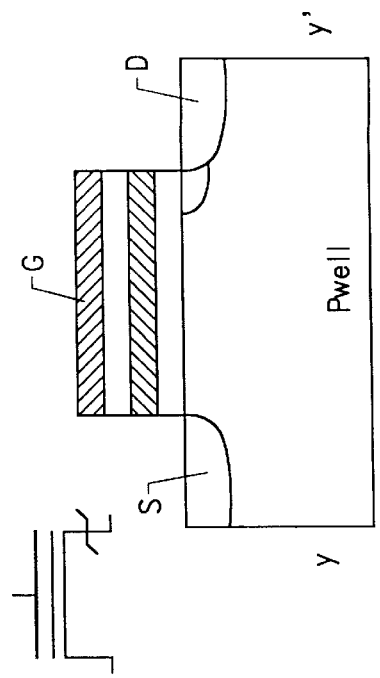
Figure 1A:
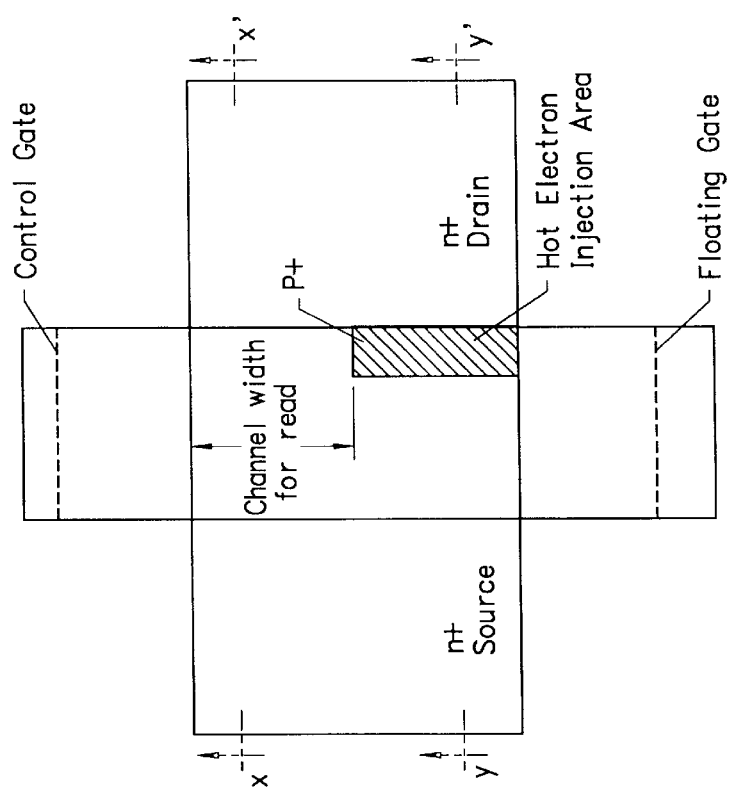
FIG. 1A is a plan view of a Zener breakdown based flash EEPROM cell.
Figure 2A:
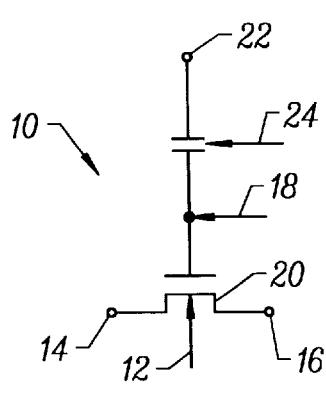
FIG. 2A is a schematic diagram of the non-volatile memory cell of the prior art.
Figure 2B:
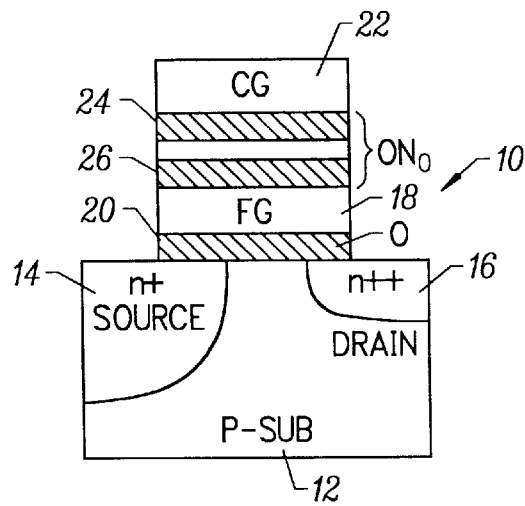
FIG. 2B shows a cross-sectional view of a non-volatile memory cell in accordance with the prior art.
Figure 3A:
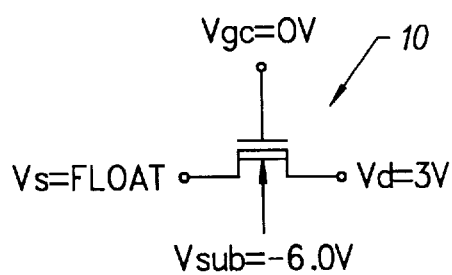
FIGS. 3A and 3B, respectively, show avalanche program and erase bias configurations of a memory cell in accordance with the prior art.
Figure 3B:
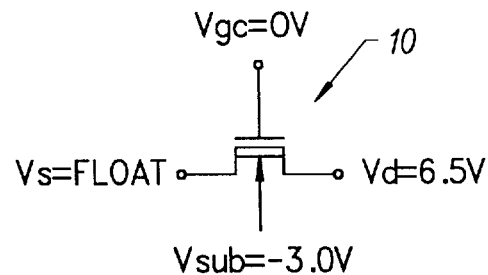
Figure 4A:
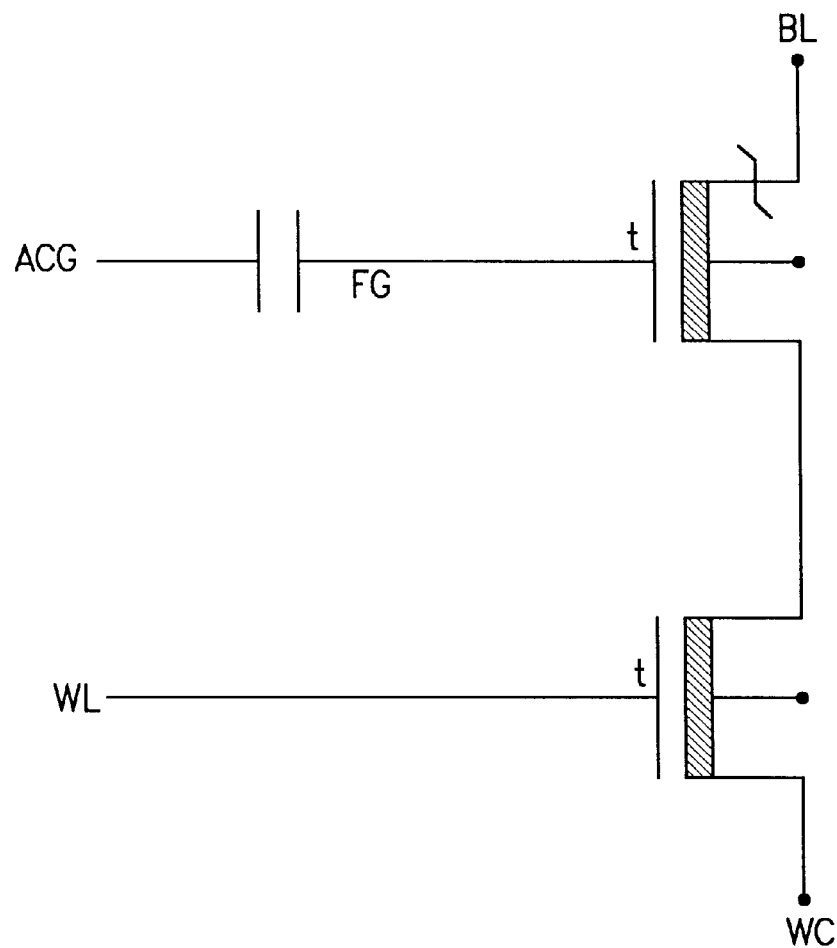
FIG. 4A is a schematic diagram of a single poly memory cell in accordance with the prior art.
Figure 5:
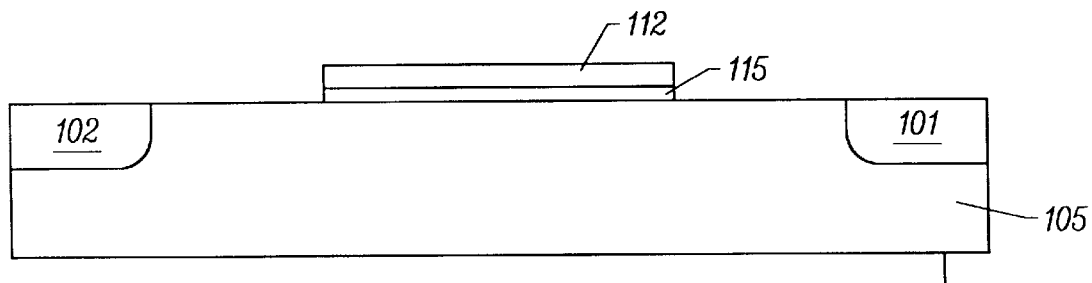
FIGS. 5–7 are cross-sections of a semi-conductor substrate and a non-volatile memory cell formed in accordance with the present invention.
Figure 6:
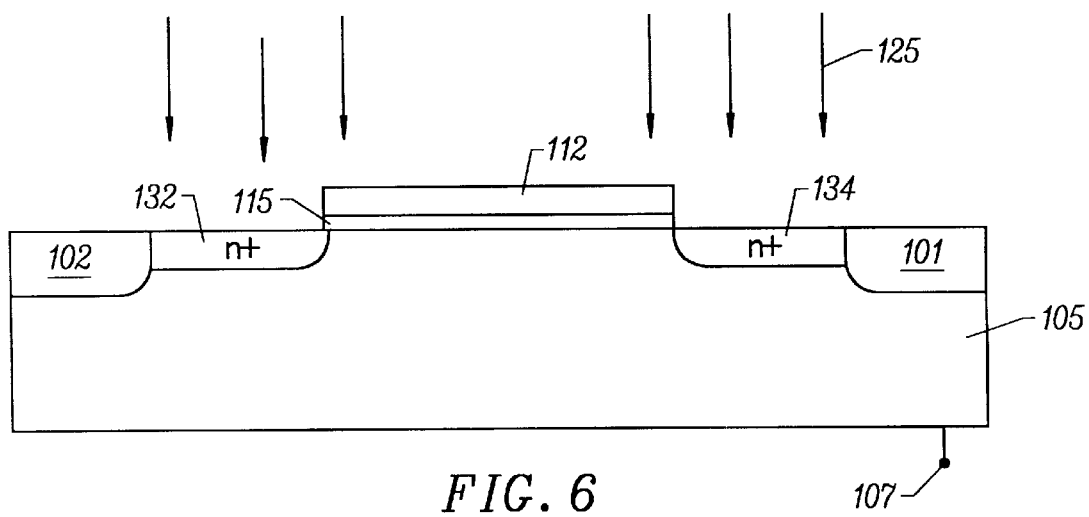
Figure 7:
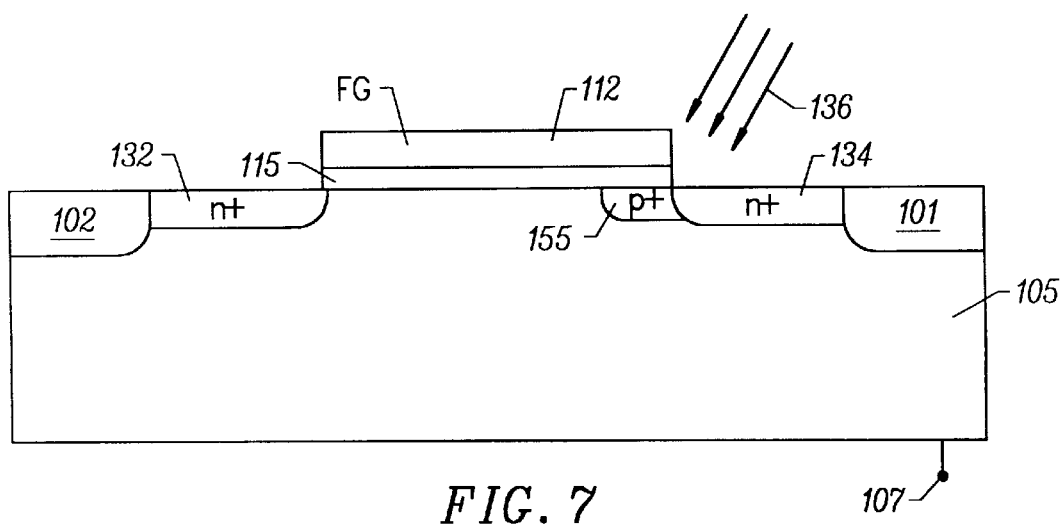

A first non-volatile memory cell structure and a method for manufacturing the structure are shown and described with respect to FIGS. 5–7. FIGS. 5–7 show an exemplary series of steps in the formation of a first embodiment of an avalanche/Zener gate structure suitable for use with the nonvolatile technologies disclosed herein.

FIG. 5 shows a substrate 105 having formed therein field oxidation regions 101 and 102, a gate oxide 115, and a floating gate 112, provided on the gate oxide 115. In one embodiment, substrate 105 may be a p-type substrate having a background doping concentration of about $1 \times 10^{15}$–$1 \times 10^{17}$ cm$^{-3}$. Field oxidation regions 101 and 102 represent device isolation structures formed in accordance with well known techniques such as LOCOS, trench isolation, shallow trench isolation and various equivalent alternatives. The shape of the isolation depicted in the figures of the present disclosure is not intended to limit the nature of the type of isolation used herein.

Gate oxide 115 and floating gate 112 are formed in accordance with conventional techniques by, for example, forming a thermal oxide on the surface of substrate 105, depositing a polysilicon layer on top of the gate oxide, and etching the gate oxide and polysilicon layers to form a gate stack comprising oxide 115 and floating gate 112. Various alternative parameters are suitable for growing the gate oxide layer and are well within the knowledge of one of average skill in the art. Likewise, numerous techniques for forming the floating gate layer may be used, including, but not limited to depositing polysilicon by chemical vapor deposition or sputtering and annealing techniques well known to one of average skill in the art. Etching of the polysilicon and gate oxide layers may be performed by any number of suitable wet or dry directional etch step in accordance with well known techniques.

Subsequent to formation of the gate stack, an impurity implant 125 of a dopant having a conductivity type opposite to that of the substrate (arsenic or phosphorus, for example) is performed to form self-aligned first active region 132 and second active region 134 in P-type substrate 105. Typical junction depths of 0.1 $\mu$m to 0.5 $\mu$m and doping concentration of about $5 \times 10^{18}$ to $1 \times 10^{21}$ cm$^{-3}$ are suitable. Substrate 105 may optionally have a connection 107 to allow for biasing the substrate.

Following implantation of the active regions 132,134, a Large Angle Tilt Implant (LATI) is utilized to form a P+ region 155 adjacent to first region 134. The P+ implant extends a portion of the width of the channel region, from a position adjacent to region 134 and improves generation of hot electrons for programming. Typically an implant of boron at an energy of 30 to 200 KeV, to a depth as great as 0.1 to 0.4 $\mu$m in a concentration of about $1 \times 10^{18}$ to $1 \times 10^{20}$ cm$^{-3}$.

Such a configuration provides the ability to utilize reverse breakdown voltages in a range of 3V to 10V in order to generate energetic hot electrons independent of the channel length of the device. It should be recognized with reference to Ranaweera, et al., that the breakdown characteristics of the various P+ N+ junctions varies with the concentration of the P+ region.

However, it will be recognized that the method of the present invention greatly simplifies the manufacture of an avalanche/Zener floating gate device over the elementary teachings provided in Ranaweera, et al. In the present invention, the LATI implant allows for a great degree of freedom in the placement of the implant, the dopant concentration, and the junction depth of the implant in the cell structure shown in FIG. 7. Yet another advantage provided is greater flexibility in the device formation process flow sequence.

Using the large angled tilt implant (LATI), the P+ region may be provided at junction depths as great as 0.1 to 0.4 $\mu$m, below the surface of substrate 100. This allows for greater control in positioning the P+ region below floating gate 110 and by adjusting the dopant concentration, and hence the reverse breakdown voltage of the overall device. Typically, the angle of the implant relative to a plane formed by the surface of the substrate is in a range of about 20° to 80°.

Exemplary operational characteristics for the device shown in FIG. 7 are given as follows: to add electrons to floating gate FG, the substrate is biased to 0V, region 130 is floating, region 134 is at, for example, 8V and the FG is coupled to a positive voltage from a control gate (not shown) larger than junction breakdown, such as 8V. To remove electrons from FG, the substrate is biased to 0V, region 130 is floating, region 134 is at 8V and FG is at a low voltage coupled from a control gate (not shown) of about 0V. It should be understood that either adding electrons (or removing holes), or removing electrons (or adding holes) can constitute a "program" or "erase" operation, as such "program" or "erase" operation is defined by the context of the overall device in which the non-volatile memory cell is used.

It should be recognized that the method and cell described with reference to FIG. 5–7 may be utilized with any number of coupling arrangements in any number of matrix arrangements shown herein or in the prior art. It should be further recognized that the method of the present invention may be utilized to construct a non-volatile device wherein the operating parameters vary from the exemplary embodiment set forth above.

In this aspect, the method of forming a memory cell improves substantially over prior art conventional techniques which are taught as being used in Ranaweera et al. In particular, the depth and concentration of the implant can be tailored to the particular device before or after formation of the gate stack, thereby simplifying device manufacture by eliminating at least the spacer formation steps particularly detailed in Ranaweera, et al. as necessary to prevent counter-doping the P+ region when implanting the active regions.

A Double Sided Pocket Implant EEPROM Cell

Figure 8A:
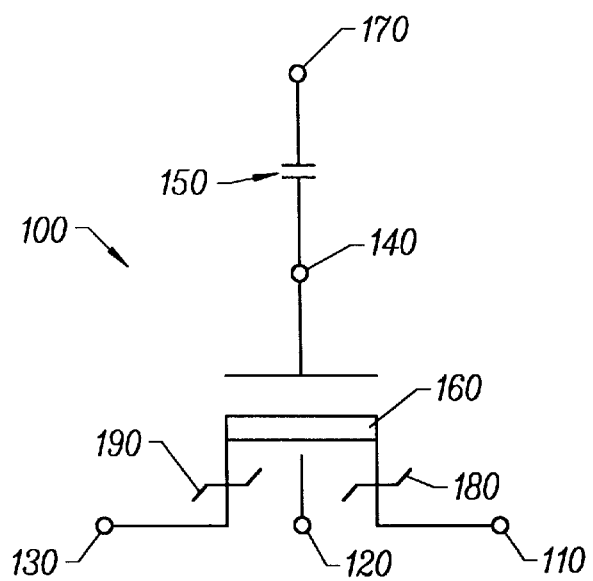
FIG. 8A is a schematic diagram of a further embodiment of a non-volatile memory cell structure of the present invention.
Figure 8B:
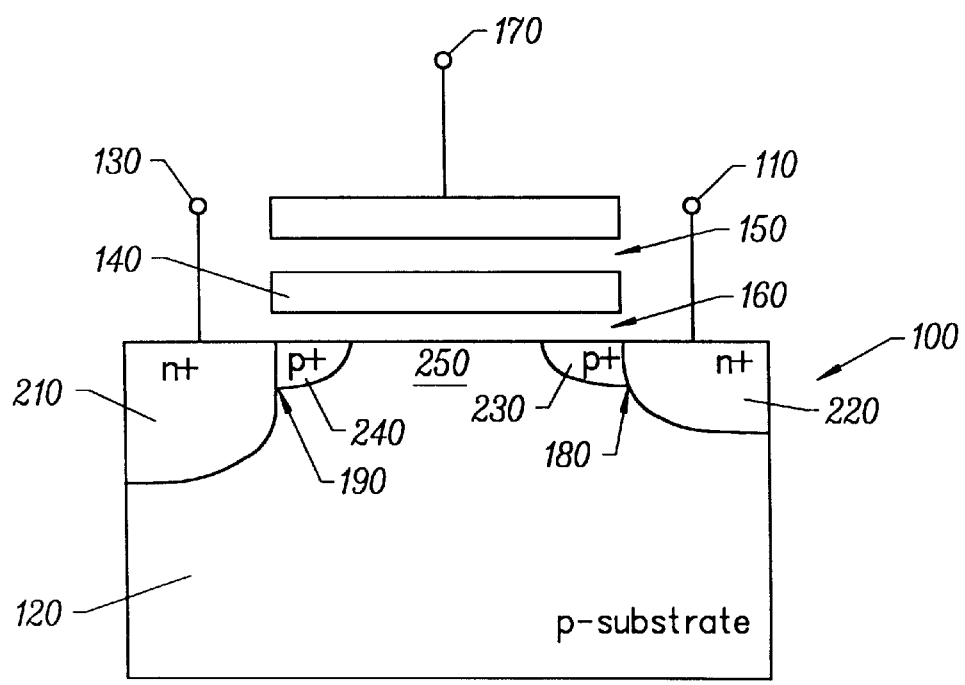
FIG. 8B is a cross-section of the embodiment of a non-volatile memory cell of FIG. 8A.

A novel EEPROM cell formed and programmed in accordance with an alternative embodiment of the present invention is shown in FIG. 8A and 8B.

In this aspect, the present invention is a nonvolatile memory cell that is programmed and erased using hot carriers/holes generated by Zener/avalanche breakdown over different regions of the cell oxide. FIG. 8A is a schematic diagram of a memory cell 100 according to the present invention. It will be recognized that although the following description describes formation in a P-type substrate, formation in an N-well is likewise contemplated. Memory cell 100 comprises a P-substrate 120 having formed therein a first program region 130, a second program region 110, a floating gate 140 insulated from and capacitively coupled to P-substrate 120 through an oxide layer 160, and a control gate 170 insulated from and capacitively coupled to floating gate 140 through a dielectric film 150. Depending on the control gate 170 bias voltage, hot electrons or hot holes generated by the Zener/avalanche breakdown of two $P^+N^+$ junctions erase or program memory cell 100.

FIG. 8B illustrates a cross-sectional view of memory cell 100 according to the present invention. Substrate 120 has formed therein a first active region 110, a second active region 130, $P^+$ implant region 230, and $P^+$ implant region 240.

Program region 110 consists of a heavily doped ($>10^{17}$ cm$^{-3}$) boron implanted $P^+$ region 230, contiguous to a shallowly diffused, heavily doped [approximately $1 \times 10^{19}$ cm$^{-3}$] $N^+$ region 220. By heavily doping $P^+$ region 230, the junction breakdown voltage $V_{PP}$ (essentially the program/erase voltage) is reduced from about 12V to 6–8V.

A reduction in $V_{PP}$ reduces the magnitude of the electric field across the channel of the transistor. This, in turn, reduces the number of electrons that are able to acquire the requisite energy to be injected onto oxide layer 160 by Fowler-Nordheim tunneling. (It is this tunneling which creates the carrier traps which cause reliability problems over time.) Because it is this hole trapping which occurs in oxide layer 160 which contributes to long-term device degradation, reducing $V_{PP}$ according to the present invention improves device reliability and enhances data retention.

Program region 130 consists of a heavily doped [($>10^{17}$ cm$^{-3}$)] boron implanted P+ region 240, contiguous to a heavily doped [$>10^{19}$ cm$^{-3}$] N+ region 210. The lightly doped $N^+$ region 210 reduces junction capacitance and improves the speed of the path used to read data from memory cell 100.

A channel region 250 in substrate 120 separates P+ region 230 from region 240. Floating gate 140 is formed over and capacitively coupled to substrate 120 through oxide layer 160. Oxide layer 160 also insulates floating gate 140 from substrate 120. Oxide layer 160 is typically 60 Å–150 Å thick and is deposited by any of a number of well-known conventional processes, including low pressure chemical vapor deposition (LPCVD). Similarly, control gate 170 is formed over and capacitively coupled to floating gate 140 through a dielectric film 150 such as $SiO_2$. Dielectric film 150 can also be deposited by-LPCVD.

According to the present invention, hot carriers generated by Zener/avalanche breakdown are employed to program and erase memory cell 100. Memory cell 100 is erased by reverse biasing the $P^+N^+$ junction 180 formed by P+ region 230 and $N^+$ region 220. $P^+N^+$ junction 180 is reverse biased by applying 8V to region 110 and 0V to substrate 120. In addition, a potential from, for example, a control gate (not shown) is applied to the floating gate 140 (of, for example, 8V) and when the floating gate potential becomes greater than that of substrate 120, the hot electrons generated in breakdown mode are "injected" into floating gate 140 through oxide layer 160. The resulting net negative voltage on floating gate 140 erases memory cell 100.

Memory cell 100 is programmed by reverse biasing the $P^+N^+$ junction 190 formed by $P^+$ region 240 and $N^+$ region 210. $P^+N^+$ junction 190 is reverse biased by applying 8V to region 130 and 0V to substrate 120. A low or zero voltage is applied to a control gate (not shown) so that the floating gate potential becomes lower than the substrate and holes are injected into floating gate FG through oxide layer 160. The resulting net positive voltage on floating gate 140 programs memory cell 100.

In keeping with the goal to constantly improve device reliability and enhance data retention, memory cell 100 utilizes hot carrier injection to program and erase through different areas of oxide layer 160. This distinction over the prior art is important since carrier traps created by Fowler-Nordheim tunneling in the prior art generally occur in the same area of oxide layer 160 and can, over time, reduce the reliability of the device.

Such surface damage can degrade long-term cell performance by reducing the cell's threshold voltage, reducing the cell's transconductance, and lowering injection efficiency during program operations. Moreover, such surface damage can interfere with current flow through channel region 250 during read operations. Such surface damage can decrease long-term cell reliability and negatively impact data retention.

Cell 100 minimizes this surface damage attributable to repeated injections of hot carriers into the floating gate 140, by programming (i.e., inject hot holes) and erasing (i.e., inject hot electrons) through two different areas of the oxide layer 160. In so doing, the memory cell 100 according to the present invention increases long-term cell reliability and enhances data retention.

A Non-volatile Cell Structure Positioned Outside the Read Path

As discussed herein, the foregoing non-volatile memory cells are typically utilized with accompanying read/sense circuitry in cell structures. Such circuitry includes means for controlling voltages applied to the respective terminals of the floating gate device, and for reading the state of the device after it is programmed.

FIGS. 9–12 show various exemplary embodiments of avalanche/Zener floating gate devices connected in EEPROM cell structures which include accompanying control circuitry.

Figure 9:
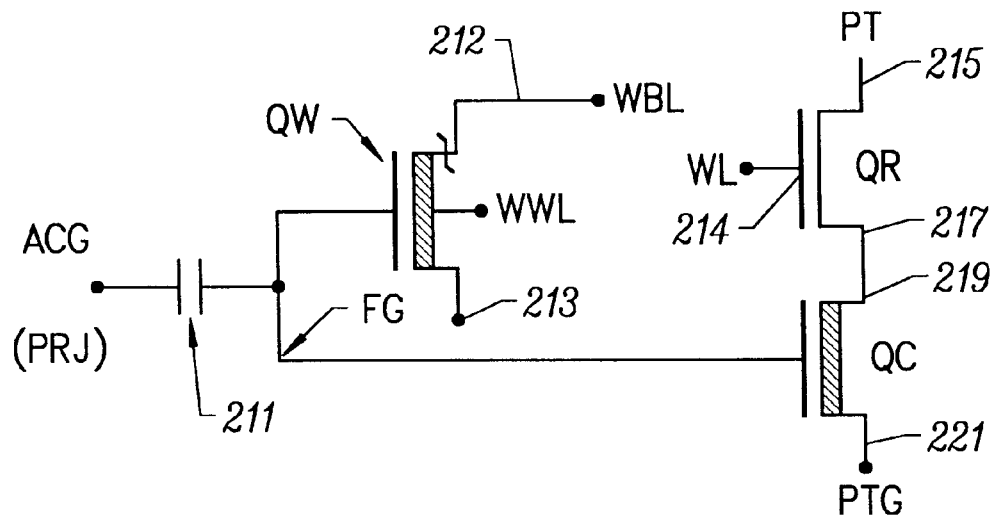
FIG. 9 is a schematic diagram of a memory cell constructed in accordance with one embodiment of the present invention.

FIG. 9 shows a schematic diagram of a first embodiment of a nonvolatile memory cell structure 210 formed in accordance with one aspect of the present invention.

Structure 210 includes an (array) control gate ACG, floating gate FG, avalanche/Zener program element $Q_w$, a read transistor $Q_r$, and a sense transistor $Q_c$. The control gate ACG is used to accelerate electrons or holes selectively to or from the floating gate by capacitively coupling a field across the oxide that separates the avalanche element from the floating gate.

Figure 10:
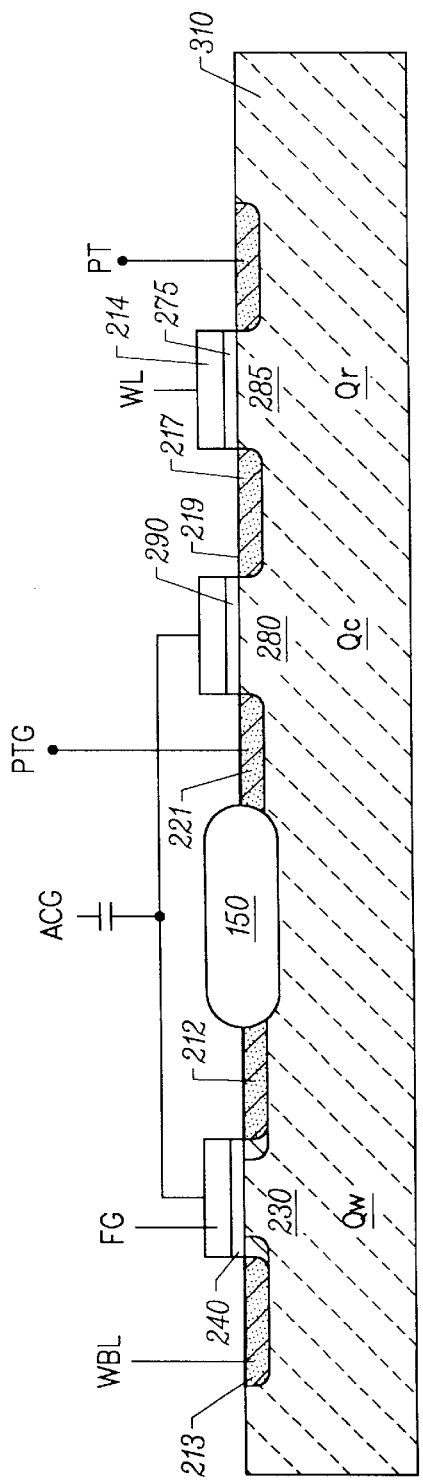
FIG. 10 is a cross-sectional diagram of an memory cell suitable for us with the embodiment of FIG. 9.

FIG. 10 is a cross section of a first embodiment of the EEPROM cell structure of FIG. 9. As shown in FIGS. 9 and 10, sense transistor $Q_c$ and avalanche element $Q_w$ share floating gate FG. Floating gate FG is capacitively coupled to array control gate (ACG) voltage via capacitor 211. Avalanche/Zener program element $Q_w$ shares floating gate FG with sense transistor $Q_c$, and includes a drain 213 connected to word bit line $WBL_e$ and source 213.

Sense transistor $Q_c$ shares region 219 with source 217 of read transistor $Q_r$. Gate 214 of read transistor $Q_r$ is connected to word line WL. The drain of read transistor $Q_r$ is connected to a read signal select (product term) PT, while the source of sense transistor $Q_c$ is connected to sense signal (product term gate) PTG.

FIG. 10 shows an exemplary cross-section of the embodiment of the EEPROM cell 210 as formed on a semiconductor substrate 310. Silicon substrate 310 has a first conductivity type such as a P-type conductivity. The EEPROM cell 210 has three separate transistors formed in the semiconductor substrate 310, namely, an avalanche/Zener element $Q_w$, a sense transistor $Q_c$ and a read transistor $Q_r$. An avalanche/Zener element $Q_w$ is electrically separated from the sense transistor $Q_c$ by a first oxide 150, e.g. silicon dioxide, also formed in the semiconductor substrate 310.

Avalanche/Zener element $Q_w$ has source 213 and a drain 212, all formed within a substrate 310 with a channel 230 positioned there between. Overlying the channel 230 is an oxide layer 240. The oxide layer 240 is typically composed of an insulating material, such as silicon dioxide, and has a thickness of approximately 80 Å. Oxide layer 240 may be deposited or grown (using conventional oxide deposition techniques) in a single process step.

Sense transistor $Q_c$ has a source 221 and a drain 219 formed in the semiconductor substrate 310. A sense channel 280 is formed between source 221 and drain 219. Overlying the channel 280 is an oxide layer 290 having an approximate thickness of 80 angstroms.

The read transistor $Q_r$ shares diffusion region 219 with the sense transistor $Q_c$. Hence, diffusion region 219 acts as the read transistor source and sense transistor drain. A channel 285 is positioned between source 217 and drain 215. Overlying the read channel is an oxide 275 layer that is composed of an insulating material, such a silicon dioxide, and has an approximate thickness of 25–100 Å. Read gate 214 overlies oxide 275, and is formed of polysilicon in accordance with well-known techniques.

Floating gate FG overlies the program transistor oxide layer 240 and sense oxide layer 290. Floating gate FG is also formed of a conducting material, such as a polycrystalline silicon material.

Figure 11:
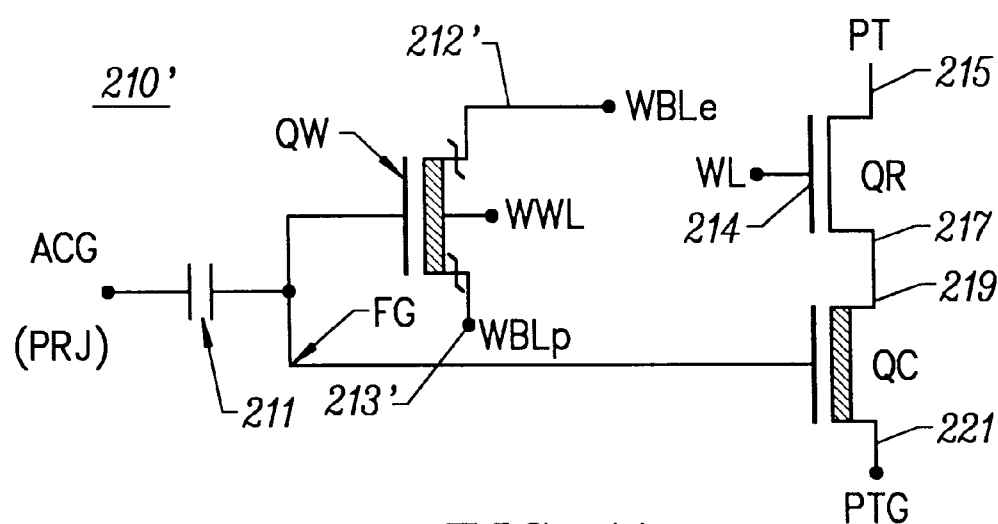
FIG. 11 is a schematic diagram of a memory cell constructed in accordance with a second embodiment of the present invention.
Figure 12:
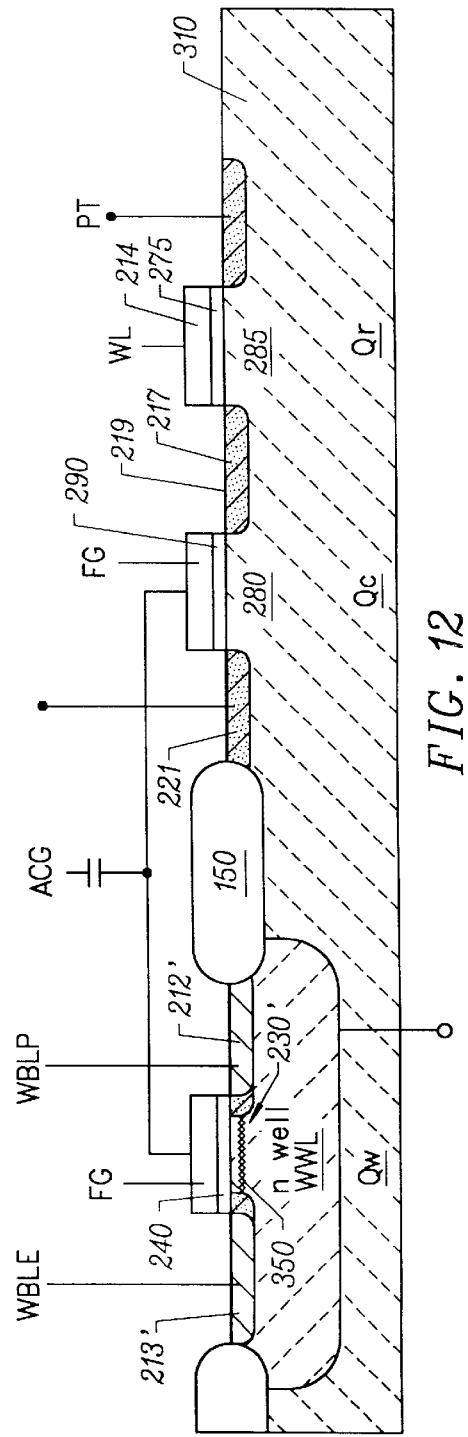
FIG. 12 is a cross-sectional diagram of an memory cell suitable for us with the embodiment of FIG. 10.

FIGS. 11 and 12 are a schematic diagram and a cross-section, respectively, of an alternative embodiment of the invention set forth above with respect to FIGS. 9 and 10. In this embodiment, a dual side (program/erase) program transistor $Q_w'$ is utilized and is formed in an n well region in substrate 310 in order to allow for easier coupling of devices in the array and provide an alternative mechanism for charging and discharging the floating gate FG.

As shown in FIG. 12, well 380 has a second conductivity type opposite the first conductivity type, such as an N conductivity type. In contrast, the program source 213' and program drain 212' have the first conductivity type, e.g. a P-type conductivity. An N+ region in well 380 provides appropriate electrical contact to metal lines in the EEPROM cell 210, such as word write line (WWL). A significant advantage of the N-well configuration shown in FIG. 12 is the isolation of the cell $Q_w$ with respect to other cells in the array. Normally, tight control over programming voltages must be maintained in order to avoid disturbing (or unintentionally programming) other cells in the array. Isolation of each program element $Q_w$ in an N-well reduces the need for this tight control due to the respective isolation of each cell.

Also illustrated in FIG. 12 is a selective channel implant region 350. Region 350 is shown with respect to channel 230' but it should be recognized that it could also be used in channel 230. Implant 350 allows one to tailor the reverse breakdown voltage of the cell to suit the particular application of the EEPROM 210.

The transistors $Q_w$, $Q_c$ and $Q_r$ of EEPROM 210 are electrically connected to certain electrical lines and gates in order to operate and control the functions of the EEPROM cell 210. As shown in FIG. 12, $WBL_e$ is electrically connected to the program source 213, $WBL_p$ connected to program drain 212, and WWL to N+ well 380. Both configurations (210,210') show an additional capacitor 211 used to capacitively couple voltage (ACG) onto the floating gate (FG). An array control gate (ACG) is capacitively coupled to the floating gate FG. A product term gate (PTG) is electrically connected to the sense source 221 of the sense transistor $Q_c$. A word line read (WL) is electrically connected to the read gate 214 of the read transistor $Q_r$ and a Product Term (PT) is electrically connected to the read drain 215.

Typical operating voltages for the foregoing lines are given in Table 1:

|  | WBL | WWL | ACG | PT | PTG | WL |
|---|---|---|---|---|---|---|
| Erase (NMOS) | 6 v | 0 v | 8 v | Float | 6 v | Vcc |
| Program (NMOS) | 6 v | 0 v | 0 v | Float | 0 v | 0 V |
| Erase (PMOS) | 0 v | 6 v | 8 v | Float | 6 v | Vcc |
| Program (PMOS) | 0 v | 6 v | 0 v | Float | 0 v | 0 V |

Again, the aforementioned voltages are exemplary and may vary with different applications. In contrast with the cell disclosed in U.S. Pat. No. 4,924,278, the cell of the present invention utilizes the avalanche/Zener injection capacities of the aforementioned prior art to place cells on the floating gate in accordance with the techniques described therein.

It should be recognized that transistor $Q_w'$ could also be formed in an NMOS embodiment, and transistor $Q_w$ in a PMOS embodiment, without diverging from-the scope of the present invention. Moreover, numerous conventional fabrication methods are suitable for adjusting the diode doping gradient of the channel region 350.

An EEPROM Array and Method for Programming

As noted above, cells of type presented herein are typically provided in an array in which a number of cells are connected to control conductors in the form of metal or diffused regions in the substrate. Control voltages are applied to these conductors in order to accomplish the goals of the integrated circuit device of which the array is a part.

Figure 13:
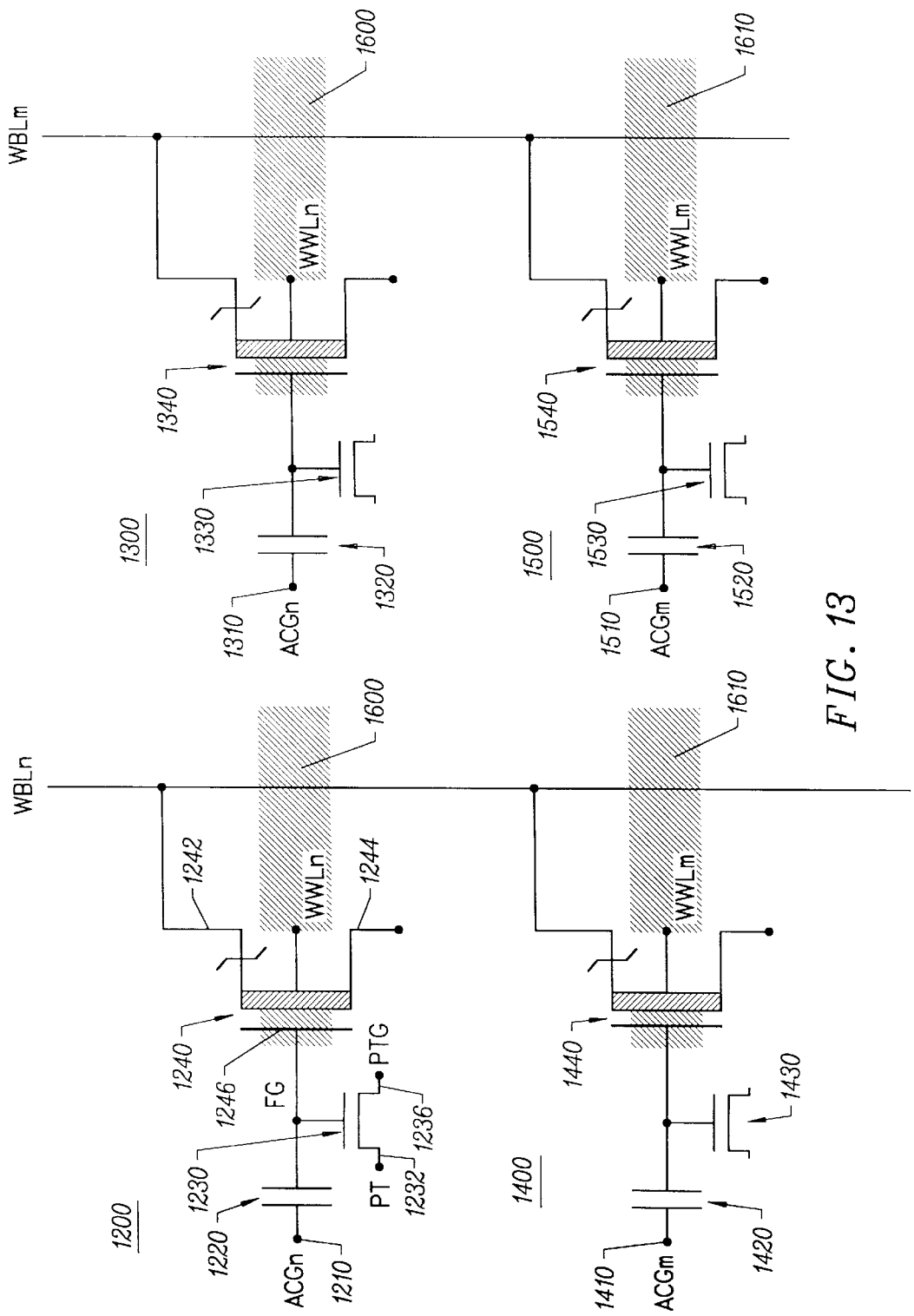
FIG. 13 is a schematic diagram of a 2×2 matrix of memory cells in accordance with the present invention.

An example of one such array structure is shown in FIG. 13. FIG. 13 shows a two-by-two matrix 1000 of non-volatile memory cells 1200, 1300, 1400, 1500 in accordance with the present invention. Cell 1200 is exemplary of each cell in the matrix and hence the structure of cells 1300, 1400 and 1500 is not specifically described, but should be readily understood by reference to like designated components designated with reference numerals (13xx, 14xx, 15xx) similar to those in cell 1200 (12xx). Cells 1200, 1300, 1400, 1500 are hereinafter described with reference to their formation as NMOS transistors in a p-doped substrate. Alternative embodiments of PMOS transistors in aptly formed well regions in the substrate will be readily apparent to one of average skill in the art.

Cell 1200 includes capacitor 1220, a floating gate transistor 1230, and an avalanche/Zener injector diode 1240. It will be understood that diode 1240 (as well as diodes 1340, 1440, 1540) can have a configuration equivalent to the avalanche/Zener-type nonvolatile memory cells disclosed as set forth herein in the preceding sections, or those discussed in Fang, et al., Haddad, et al., or Ranaweera, et al.

Diode 1240 includes a drain region 1242 connected to a first program line (WBL)$_n$ and a source region 1244, and floating gate (FG) at region 1246. Nonvolatile floating gate transistor 1230 includes a source 1232 and drain 1236, and floating gate (FG) connected at point 1234. Floating gate (FG) is connected in common with the control gate capacitor 1220. Transistor 1230 provides the sense element for circuitry (such as read circuitry, not shown) which is utilized in detecting the state of the cell. The source and drain of transistor 1230 may be connected to read circuitry and electrical couplings as discussed above, or in any number of other well-known manners.

Cells 1200 and 300 share a first common array control gate (ACG) connection ACG$_n$ at terminals 1210, 1310, connected to capacitors 1220, 1320, respectively. Likewise, each avalanche injector diode 1240, 1340, in a novel aspect of the present invention, shares a first common Word Line Connector WWL$_n$.

It will be readily recognized that the particular construction of the avalanche cells, and the construction of the floating gate transistors, may be varied in accordance with the principles of the present invention.

In one exemplary application of the voltages applied on the respective conductors in accordance with the present invention, only one cell in the array, in this case cell 200, will have an avalanche injector diode which is in breakdown mode, while each of the other cells will not be in breakdown mode assuming a breakdown state of 6V, where six volts are above the avalanche breakdown mode, while three volts are below. Hence, in one embodiment, gated diodes 1240, 1340, 1440, 1540 are only in avalanche breakdown mode when WBL equals four and WWL equals zero on an individual cell. The selected cell (1200 in this example) may be charged to $+V_e$ or $-V_P$ (and hence erased or programmed) according to the bias on the ACG. Cells 1300 and 1400 have a breakdown voltage of only 2 volts and hence are not in avalanche mode. Cell 1500 has zero volts on both WWL$_m$ and WBL$_m$ and hence there is zero voltage across the breakdown region.

It should be understood that any number of cells may be utilized in accordance with the teachings of the present invention.

The many features and advantages of the present invention will be apparent to one of average skill in the art in view of the illustrative embodiments set forth herein. The present invention has been described herein with respect to particular embodiments for a particular applications. It will be apparent to one of average skill in the art that numerous modifications and adaptations of the present invention may be made in accordance with the invention without departing from the spirit of the scope of the invention as disclosed herein and defined by the following claims.

What is claimed is:

1. A method for manufacturing an avalanche/Zener breakdown, non-volatile EEPROM memory cell, comprising the sequential steps of:
   (a) providing a semiconductor substrate having a surface;
   (b) forming a gate stack on the surface of the substrate;
   (c) forming a first active region and a second active region into the substrate so that the first and second active regions extend to a depth below the surface of the substrate and have a first impurity type and an impurity concentration; and
   (d) implanting at an angle non-normal to the surface of the substrate a pocket region of an opposite conductivity type to that of the first or second active region into the surface of the substrate adjacent to the first region, the pocket region being formed such that a P/N junction between said first active region and said pocket region has an avalanche/Zener breakdown in the range of 4–8V between a voltage applied to the substrate and a voltage applied to said first active region.

2. The method as defined in claim 1 wherein said step of implanting comprises implanting at an angle in the range of 20 to 80° relative to a plane defined by the surface of the substrate.

3. The method as defined in claim 1 wherein said step of implanting comprises implanting a p-type impurity to a depth in the range of about 0.1 $\mu$m to 0.5 $\mu$m.

4. The method as defined in claim 1 wherein said step of implanting comprises implanting an n-type impurity to a depth in the range of about 0.1 $\mu$m to 0.5 $\mu$m.

5. The method as defined in claim 1 wherein the energy of the implant is sufficient to implant the region to a depth below the depth of the adjacent first region.

6. The method as defined in claim 1 wherein said step (d) is performed at an energy sufficient to provide the pocket implant region to a depth of about 0.1 to 0.3 micron below the surface of the substrate.

7. A method for manufacturing a non-volatile EEPROM memory cell, comprising the sequential steps of:
   (a) forming a gate stack on a surface of a semiconductor substrate;
   (b) forming a first active region and a second active region in the substrate so that the first active and second regions extend to a depth below the surface of the substrate and have an N-type impurity and an impurity concentration greater than about $5 \times 10^{16}$ cm$^{-3}$;
   (c) implanting, at a first angle, a first contiguous region of a P-type impurity into the surface of the substrate adjacent to the first active region, the first contiguous region formed to a doping concentration of greater than about $10^{17}$ cm$^{-3}$; and
   (d) implanting at a second angle a second contiguous region of a P-type impurity into the surface of the substrate adjacent to the second active region, the second contiguous region formed to a doping concentration of greater than about $10^{17}$ cm$^{-3}$.

8. The method of claim 7 wherein said first angle and said second angle are equal and opposite.

9. The method of claim 7 wherein said first angle and said second angle are not equal.

10. The method as defined in claim 7 wherein each said angle is in the range of about 20 to 80° relative to a plane defined by the surface of the substrate.

11. The method of claim 7 wherein said steps (c) and (d) provide a first and second P/N junctions having an avalanche/Zener breakdown in the range of 4–8V.

12. A method for manufacturing an avalanche/Zener breakdown programmed non-volatile EEPROM memory cell, comprising the sequential steps of:

(a) providing a substrate of a first conductivity type;
(b) forming a well region of a second, opposite conductivity type in the substrate;
(c) forming a gate stack on the surface of the substrate;
(d) forming a first active region and a second active region into the substrate so that the first and second active regions extend to a depth below the surface of the substrate and have a the first impurity type and an impurity concentration; and
(e) implanting at an angle non-normal to the surface of the substrate a contiguous region of the second conductivity type to that of the first or second region into the surface of the substrate adjacent to the first region, the contiguous region being formed such that a P/N junction between said first active region and said pocket region has an avalanche/Zener breakdown in the range of 4–8V between a voltage applied to the substrate and a voltage applied to said first active region.

13. The method as defined in claim 12 wherein said step (e) comprises implanting a p-type impurity to a depth in the range of about 0.1 μm to 0.5 μm.

14. The method as defined in claim 12 wherein said step (e) comprises implanting an n-type impurity to a depth in the range of about 0.1 μm to 0.5 μm.

15. The method as defined in claim 12 wherein the energy of the implant is sufficient to implant the region to a depth below the depth of the adjacent drain region.

16. The method as defined in claim 12 wherein said step (e) is performed at an energy sufficient to provide the contiguous region to a depth of about 0.1 to 0.3 micron below the surface of the substrate.

* * * * *